(12) United States Patent
Kihara et al.

(10) Patent No.: US 9,607,811 B2
(45) Date of Patent: Mar. 28, 2017

(54) WORKPIECE PROCESSING METHOD

(71) Applicant: TOKYO ELECTRON LIMITED, Tokyo (JP)

(72) Inventors: Yoshihide Kihara, Miyagi (JP); Toru Hisamatsu, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/866,467

(22) Filed: Sep. 25, 2015

(65) Prior Publication Data

US 2016/0099131 A1    Apr. 7, 2016

(30) Foreign Application Priority Data

Oct. 7, 2014   (JP) ................. 2014-206614

(51) Int. Cl.
| | | |
|---|---|---|
| H01L 21/3065 | (2006.01) | |
| B44C 1/22 | (2006.01) | |
| H01J 37/32 | (2006.01) | |
| H01L 21/02 | (2006.01) | |
| H01L 21/033 | (2006.01) | |

(52) U.S. Cl.
CPC .... *H01J 37/3244* (2013.01); *H01J 37/32009* (2013.01); *H01J 37/32532* (2013.01); *H01L 21/02164* (2013.01); *H01L 21/02258* (2013.01); *H01L 21/02274* (2013.01); *H01L 21/0337* (2013.01)

(58) Field of Classification Search
None
See application file for complete search history.

(56) References Cited

U.S. PATENT DOCUMENTS

| | | | | |
|---|---|---|---|---|
| 2011/0318931 | A1* | 12/2011 | Min .................... | H01L 21/0337 438/696 |
| 2014/0134812 | A1* | 5/2014 | Kim .................. | H01L 21/28185 438/270 |
| 2015/0000842 | A1* | 1/2015 | Hirano .................... | G05B 11/01 156/345.28 |
| 2016/0099148 | A1* | 4/2016 | Kihara ................ | H01L 21/0338 438/695 |

FOREIGN PATENT DOCUMENTS

JP         2011-82560 A     4/2011

* cited by examiner

*Primary Examiner* — Shamim Ahmed
(74) *Attorney, Agent, or Firm* — Rothwell, Figg, Ernst & Manbeck, P.C.

(57) ABSTRACT

Disclosed is a method of processing a workpiece including a mask. The processing method includes: a first process of generating plasma of a first gas containing a silicon halide gas in a processing container of a plasma processing apparatus that accommodates a workpiece having a mask, to form a reactive precursor; a second process of purging a space in the processing container; a third process of generating plasma of a second gas containing oxygen gas in the processing container to form a silicon oxide film; and a fourth process of purging the space in the processing container. In the processing method, a sequence including the first to fourth processes is repeated.

9 Claims, 11 Drawing Sheets

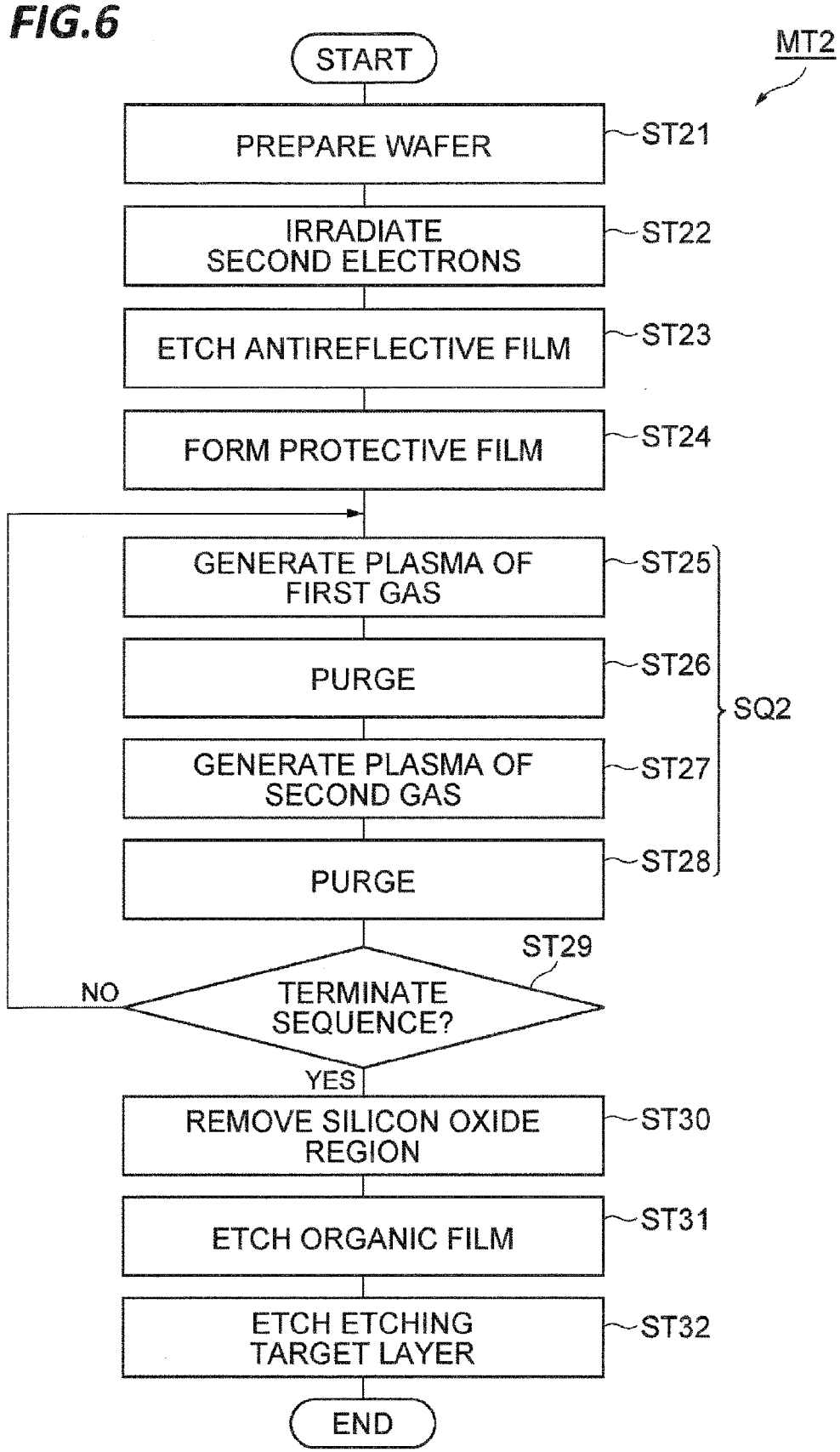

WORKPIECE PROCESSING METHOD

CROSS-REFERENCE TO RELATED APPLICATIONS

This application is based on and claims priority from Japanese Patent Application No. 2014-206614, filed on Oct. 7, 2014, with the Japan Patent Office, the disclosure of which is incorporated herein in its entirety by reference.

TECHNICAL FIELD

Exemplary embodiments disclosed herein relate to a method of processing an object to be processed ("workpiece"). In particular, the exemplary embodiments relate to a method including fabrication of a mask.

BACKGROUND

In a manufacturing process of electronic devices such as semiconductor devices, a mask is formed on an etching target layer, and etching is performed in order to transfer a pattern of the mask to the etching target layer. In general, a resist mask is used as the mask. The resist mask is formed by a photolithography technique. Accordingly, a critical dimension of the pattern formed on the etching target layer is affected by a resolution limit of the resist mask formed by the photolithography technique.

With a recent high integration of the electronic devices, what is required is to form a pattern with a size smaller than the resolution limit of the resist mask. Therefore, as disclosed in Japanese Patent Laid-Open Publication No. 2011-82560, a technique has been suggested to reduce a width of an opening defined by the resist mask by depositing a silicon oxide film on a resist mask.

Specifically, in the technique disclosed in Japanese Patent Laid-Open No. 2011-82560, the silicon oxide film is formed on the resist mask by an atomic layer deposition (ALD) method. More specifically, an organic silicon-containing source gas and activated oxygen species are alternately supplied into a processing container that accommodates a workpiece. As the source gas, aminosilane gas is used.

SUMMARY

According to an aspect, the present disclosure provides a method of processing a workpiece including a mask. The processing method includes: a first process of generating plasma of a first gas containing a silicon halide gas in a processing container of a plasma processing apparatus that accommodates a workpiece having a mask, to form a reactive precursor; a second process of purging a space in the processing container; a third process of generating plasma of a second gas containing oxygen gas in the processing container to form a silicon oxide film; and a fourth process of purging the space in the processing container. A sequence including the first to fourth processes is repeated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a flowchart illustrating a workpiece processing method according to another exemplary embodiment.

DETAILED DESCRIPTION

Figure 1:
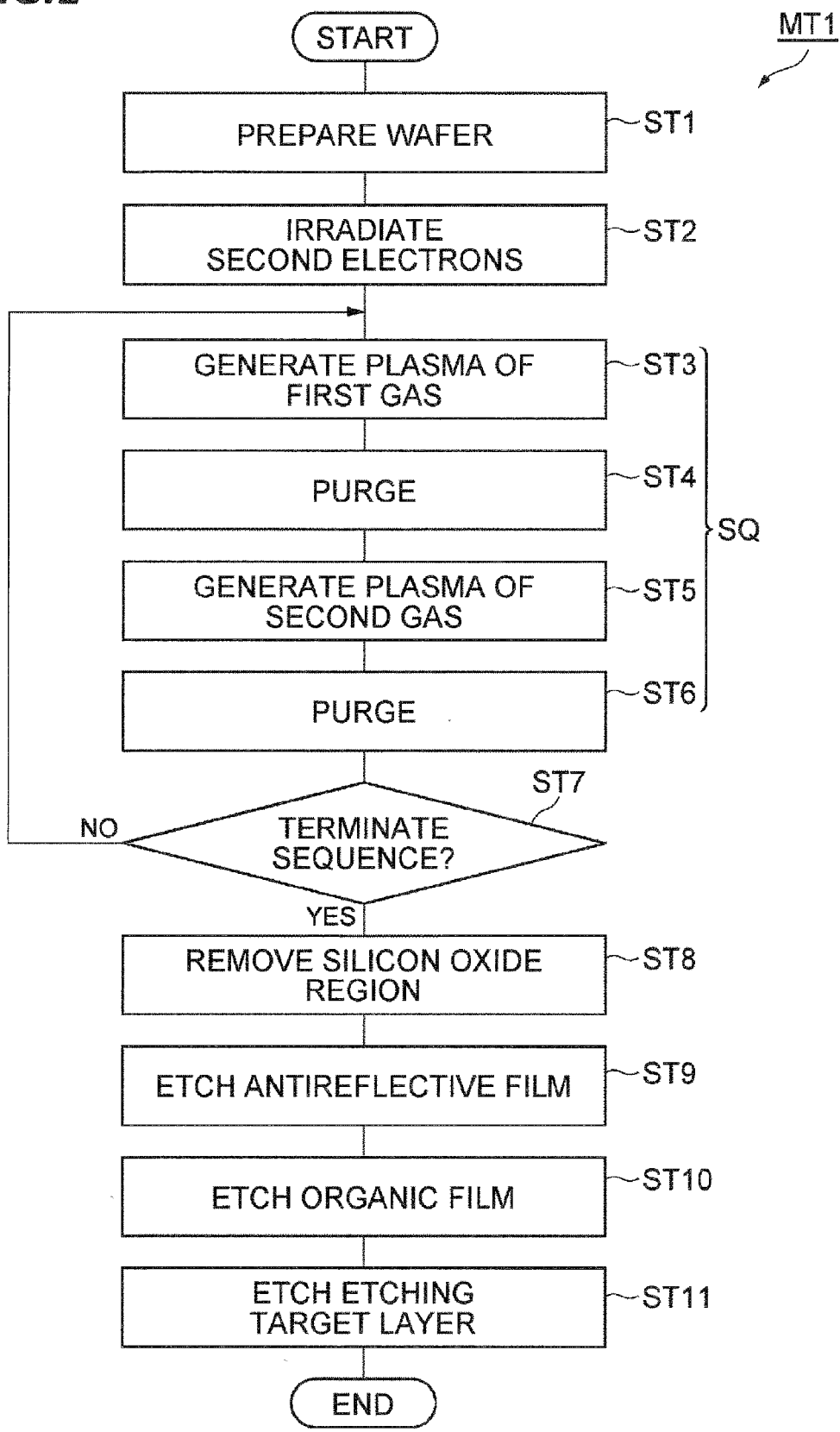
FIG. 1 is a flowchart illustrating a workpiece processing method according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Since aminosilane is a liquid at normal temperature, an apparatus for vaporizing the aminosilane is required in order to use the ALD method disclosed in Japanese Patent Laid-Open No. 2011-82560. Thus, a dedicated film forming apparatus is required. In addition, in a film formation using the aminosilane gas, it is necessary to maintain the workpiece at a high temperature. Therefore, the workpiece may be damaged, and characteristics of electronic devices to be manufactured, such as, for example, an electric characteristic, may be deteriorated.

Accordingly, in order to adjust an opening width of the mask, what is required is to form the silicon oxide film at a low temperature without using any dedicated film forming apparatus.

According to an aspect, the processing method includes: a first process of generating plasma of a first gas containing a silicon halide gas in a processing container of a plasma processing apparatus that accommodates a workpiece having a mask, to form a reactive precursor; a second process of purging a space in the processing container; a third process of generating plasma of a second gas containing oxygen gas in the processing container to form a silicon oxide film; and a fourth process of purging the space in the processing container, in which a sequence including the first to fourth processes is repeated.

The silicon halide gas such as, for example, $SiCl_4$ gas, $SiBr_4$ gas, $SiF_4$ gas, or $SiH_2Cl_2$ gas, lies in a vaporized state at normal temperature. Therefore, in the method according to the exemplary embodiment, the silicon-containing precursor may be deposited on the mask at a low temperature without using a dedicated film forming apparatus including a vaporizer. Further, in the method, a purge is performed in the second process, and the halogen atoms are substituted by oxygen to form a silicon oxide film in the subsequent third process. Thereafter, the purge is performed in the fourth process. In the second process and the fourth process, the purge is performed for the purpose of substituting the gas in the processing container in order to prevent the silicon halide gas and the oxygen gas from existing in the processing container at the same time. The purge may be either a gas purge in which an inert gas is poured into the processing container or a purge by evacuation. Accordingly, as in the ALD method, a thin silicon oxide film may be formed on the mask with a relatively uniform film thickness by executing a sequence including the first to fourth processes once. That is, a thin silicon oxide film may be conformally formed by executing the sequence once. Therefore, the method is excellent in controllability of adjusting the opening width of the mask. Further, since the mask is covered by the silicon oxide film, a line edge roughness (LER) of the mask may also be enhanced.

Further, in the method, the film thickness of the silicon oxide film to be formed may be adjusted by the number of times of repeating the sequence. Thus, the opening width of the mask may be adjusted to a desired opening width.

In an exemplary embodiment, in the first process, the processing container may be set under a high-pressure and low-power condition that a pressure therein is 13.33 Pa or more and a power of a high-frequency power source for plasma generation is 100 W or less. By generating the plasma under the high-pressure and low-power condition, it is possible to suppress excessive generation of active species of the halogen atoms. Accordingly, it is possible to suppress damage to the mask and/or damage to the silicon oxide film which has already been formed. Further, a difference in film thickness between respective regions on the mask may be reduced. Further, when a densely provided mask region and a loosely provided mask region are present, that is, when loose and dense regions are present in the pattern of the mask, it is possible to reduce the difference in film thickness of the silicon oxide films to be formed in both regions.

Further, in an exemplary embodiment, no bias power for drawing ions is applied to a pedestal that supports the workpiece. According to the exemplary embodiment, with respect to a mask shape in an unevenness portion, the uniformity of the film thickness of each silicon oxide film formed in a top surface and side surfaces of the mask, and a surface of a base of the mask, may be further enhanced.

In an exemplary embodiment, the workpiece further includes an etching target layer, an organic film formed on the etching target layer, and a silicon-containing antireflective film formed on the organic film. The mask is a resist mask provided on the antireflective film. The method of the exemplary embodiment further includes: removing a silicon oxide region on a surface of the antireflective film by the plasma generated in the processing container; etching the antireflective film by the plasma generated in the processing container; and etching the organic film by the plasma generated in the processing container, after executing the sequence including the first to fourth processes. According to the exemplary embodiment, the silicon oxide film is formed on the resist mask, the width of the opening of the resist mask is adjusted, and then, the silicon oxide region on the antireflective film is removed. Then, the antireflective film and the organic film are etched to form a mask for etching the etching target layer.

In an exemplary embodiment, the plasma processing apparatus may be a capacitively coupled plasma processing apparatus. The method of the exemplary embodiment may further include: irradiating secondary electrons to the mask by generating plasma in the processing container; and applying a negative DC voltage to an upper electrode of the plasma processing apparatus, before executing the sequence including the first to fourth processes. According to the exemplary embodiment, the resist mask may be modified so as to suppress damage to the resist mask due to the subsequent processes.

In another exemplary embodiment, the workpiece further includes an etching target layer and an organic film formed on the etching target layer. The mask is provided on the organic film. The method of the exemplary embodiment further includes: etching an antireflective film having a resist mask thereon by the plasma generated in the processing container, so that the mask is formed from the antireflective film; and etching the organic film by the plasma generated in the processing container. In the method of the exemplary embodiment, the sequence including the first to fourth processes is executed between the etching of the antireflective film and the etching of the organic film. Further, the method of the exemplary embodiment further includes: removing a silicon oxide region on a surface of the organic film by the plasma generated in the processing container, after executing the sequence including the first to fourth processes. In the method of the exemplary embodiment, the silicon oxide film is formed on the mask formed from the antireflective film, the width of the opening of the mask is adjusted, and then, the silicon oxide region on the organic film is removed. Then, the organic film is etched to form a mask for etching the etching target layer.

In an exemplary embodiment, the plasma processing apparatus is a capacitively coupled plasma processing apparatus. The method of the exemplary embodiment further includes: irradiating secondary electrons to the resist mask by generating plasma in the processing container; and applying a negative DC voltage to an upper electrode of the plasma processing apparatus, before etching the antireflective film. According to the exemplary embodiment, the resist mask may be modified so as to suppress damage to the resist mask due to the subsequent processes.

Further, in an exemplary embodiment, the method may further include: forming a silicon oxide protective film on the workpiece, after etching the antireflective film and before executing the sequence including the first to fourth processes. According to the exemplary embodiment, the organic film may be protected from the plasma of the oxygen gas generated in the third process.

In an exemplary embodiment, the plasma processing apparatus is a capacitively coupled plasma processing apparatus. In the forming of the silicon oxide protective film, plasma may be generated in the processing container and a negative DC voltage may be applied to a silicon upper electrode of the plasma processing apparatus. In the exemplary embodiment, silicon is released from the upper electrode. In addition, oxygen is released from a member exposed to the plasma in the processing container. Then, the released silicon and oxygen are bonded to form a silicon oxide protective film.

In an exemplary embodiment, in the forming of the silicon oxide protective film, plasma of a mixed gas containing a silicon halide gas and oxygen gas is generated in the processing container. According to the exemplary embodiment, the silicon oxide protective film is formed by a plasma CVD method.

In an exemplary embodiment, the plasma processing apparatus is a capacitively coupled plasma processing apparatus. In the forming of the silicon oxide protective film, a high frequency power for plasma generation is supplied to a silicon oxide upper electrode of the plasma processing apparatus to generate plasma of a mixed gas containing hydrogen gas and a noble gas. In the exemplary embodiment, the protective film is formed by the silicon oxide released from the upper electrode.

As described above, in order to adjust the opening width of the mask, the silicon oxide film may be formed at a low temperature without using any dedicated film forming apparatus.

Hereinafter, various exemplary embodiments will be described in detail with reference to the accompanying drawings. In addition, in the respective drawings, the same or corresponding components will be given the same reference numerals.

FIG. 1 is a flowchart illustrating a workpiece processing method according to an exemplary embodiment. Method MT1 illustrated in FIG. 1 is a method of reducing an opening width of a resist mask of a workpiece (hereinafter, referred to as a "wafer W"). Method MT1 of the exemplary embodiment is also a method of etching an etching target layer. Further, in method MT1 of the exemplary embodiment, a series of processes may be executed using a single plasma processing apparatus.

Figure 2:
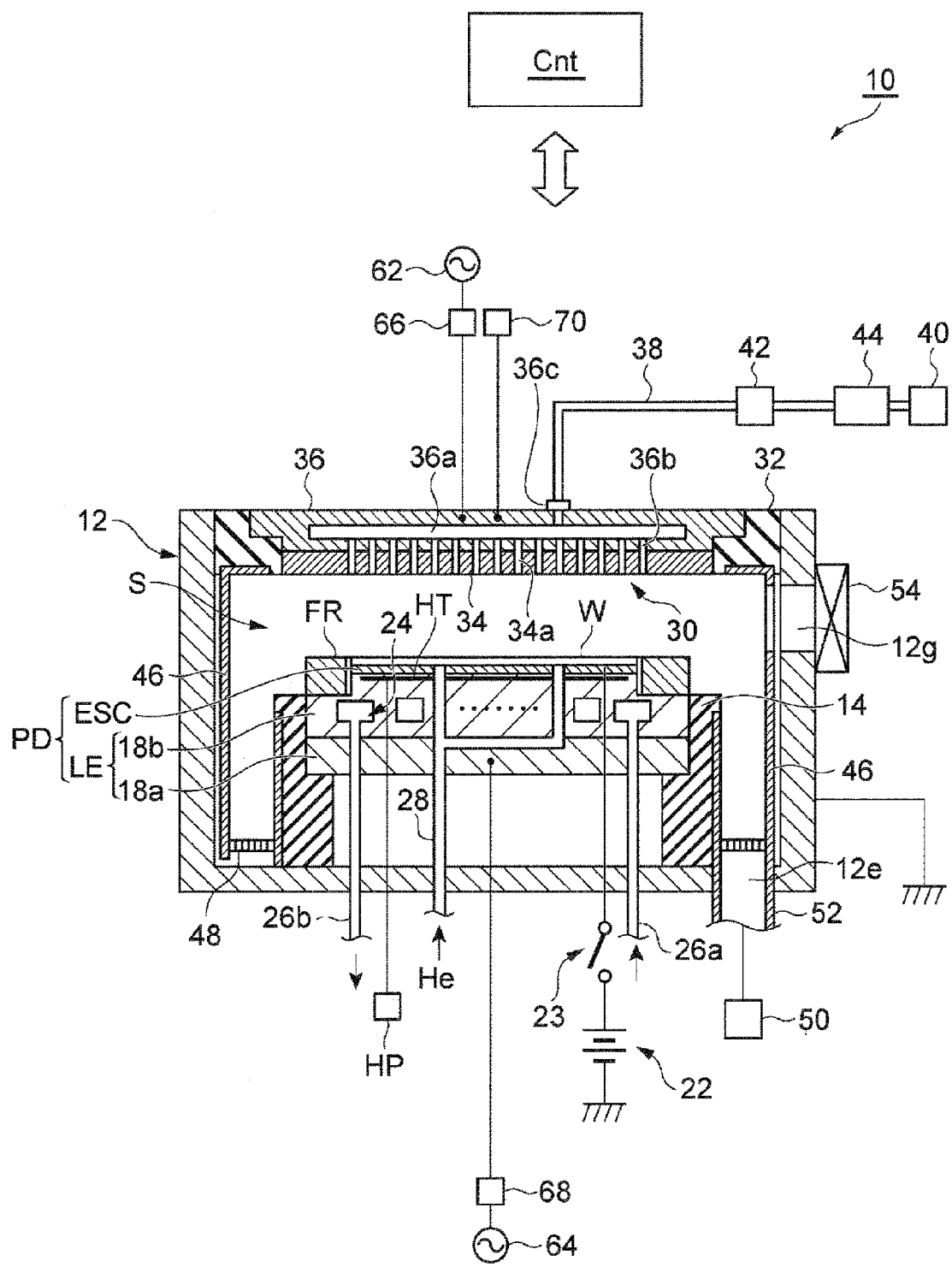
FIG. 2 is a view illustrating an exemplary plasma processing apparatus.

FIG. 2 is a view illustrating an exemplary plasma processing apparatus. FIG. 2 illustrates a schematic sectional structure of a plasma processing apparatus 10 which may be used in various exemplary embodiments of the workpiece processing method. As illustrated in FIG. 2, the plasma processing apparatus 10 is a capacitively coupled plasma etching apparatus, and includes a processing container 12. The processing container 12 has a substantially cylindrical shape. The processing container 12 is made of, for example, aluminum, and the inner wall thereof is subjected to an anodizing processing. The processing container 12 is grounded for safety.

A substantially cylindrical support 14 is provided on a bottom of the processing container 12. The support 14 is made of, for example, an insulating material. The insulating material constituting the support 14 may include oxygen, like quartz. In the processing container 12, the support 14 extends vertically from the bottom of the processing container 12. Further, a pedestal PD is provided in the processing container 12. The pedestal PD is supported by the support 14.

The pedestal PD holds the wafer W on its top surface. The pedestal PD includes a lower electrode LE and an electrostatic chuck ESC. The lower electrode LE includes a first plate 18a and a second plate 18b. The first plate 18a and the second plate 18b are made of a metal such as, for example, aluminum, and has a substantially disc shape. The second plate 18b is provided on the first plate 18a, and electrically connected to the first plate 18a.

The electrostatic chuck ESC is provided on the second plate 18b. The electrostatic chuck ESC has a structure in which an electrode serving as a conductive film is disposed between a pair of insulating layers or insulating sheets. The electrode of the electrostatic chuck ESC is electrically connected with a DC power source 22 via a switch 23. The electrostatic chuck ESC attracts the wafer W by electrostatic force such as Coulomb force generated by DC voltage applied from the DC power source 22. In this manner, the electrostatic chuck ESC can hold the wafer W.

A focus ring FR is disposed on a periphery of the second plate 18b to surround an edge of the wafer W and the electrostatic chuck ESC. The focus ring FR is provided in order to enhance uniformity of the etching. The focus ring FR is made of a material which is appropriately selected depending on a material of a film to be etched, for example, quartz.

A coolant path 24 is formed inside the second plate 18b. The coolant path 24 constitutes a temperature adjusting mechanism. A coolant is supplied from a chiller unit, which is provided outside the processing container 12, to the coolant path 24 through a pipe 26a. The coolant supplied to the coolant path 24 returns to the chiller unit through a pipe 26b. The coolant is circulated and supplied to the coolant path 24 in this manner. The temperature of the wafer W supported by the electrostatic chuck ESC is controlled by controlling the temperature of the coolant.

Further, the plasma processing apparatus 10 includes a gas supply line 28. The gas supply line 28 supplies a heat transfer gas such as, for example, helium (He) gas, from a heat transfer gas supply mechanism to a gap between the top surface of the electrostatic chuck ESC and the rear surface of the wafer W.

In addition, the plasma processing apparatus 10 includes a heater HT which is a heating device. The heater HT is embedded in, for example, the second plate 18b. The heater HT is connected with a heater power source HP. A power is supplied from the heater power source HP to the heater HP, so that the temperature of the pedestal PD is adjusted, and the temperature of the wafer W placed on the pedestal PD is adjusted. Further, the heater HT may be embedded in the electrostatic chuck ESC.

Further, the plasma processing apparatus 10 includes an upper electrode 30. The upper electrode 30 is disposed above the pedestal PD to face the pedestal PD. The lower electrode LE and the upper electrode 30 are provided substantially in parallel to each other. A processing space S is provided between the upper electrode 30 and the lower electrode LE to perform a plasma processing on the wafer W.

The upper electrode 30 is supported in the upper portion of the processing container 12 through an insulating shielding member 32. The insulating shielding member 32 is made of an insulating material that may contain oxygen, such as, for example, quartz. The upper electrode 30 may include an electrode plate 34 and an electrode support 36. The electrode plate 34 faces the processing space S. The electrode plate 34 includes a plurality of gas ejection holes 34a formed therein. In an exemplary embodiment, the electrode plate 34 is made of silicon. Further, in another exemplary embodiment, the electrode plate 34 may be made of silicon oxide.

The electrode support 36 detachably supports the electrode plate 34, and may be made of a conductive material such as, for example, aluminum. The electrode support 36 may have a water-cooling structure. A gas diffusion chamber 36a is provided inside the electrode support 36. A plurality of gas passage holes 36b communicating with the gas ejection holes 34a extends downwardly from the gas diffusion chamber 36a. Further, the electrode support 36 is formed with a gas inlet 36c configured to guide a processing gas to the gas diffusion chamber 36a. The gas inlet 36c is connected with a gas supply pipe 38.

The gas supply pipe 38 is connected with a gas source group 40 through a valve group 42 and a flow rate controller group 44. The gas source group 40 includes a plurality of gas sources. The gas sources may include a source of a silicon halide gas, a source of oxygen gas, a source of nitrogen gas, a source of a fluorocarbon gas, and a source of a noble gas. The silicon halide gas may be $SiCl_4$ gas. Further, the silicon halide gas may be $SiBr_4$ gas, $SiF_4$ gas, or $SiH_2Cl_2$ gas. Further, the fluorocarbon gas may be any fluorocarbon gas such as $CF_4$ gas, $C_4F_6$ gas, or $C_4F_8$ gas. Further, the noble gas may be any noble gas such as He gas or Ar gas.

The valve group 42 includes a plurality of valves. The flow rate controller group 44 includes a plurality of flow rate controllers such as, for example, mass flow controllers. Each gas source of the gas source group 40 is connected to the gas supply pipe 38 through the corresponding valve of the valve group 42 and the corresponding flow rate controller of the flow rate controller group 44. Therefore, the plasma processing apparatus 10 is capable of supplying gases of one or more gas sources selected from the plurality of gas sources of the gas source group 40, into the processing container 12 at an individually adjusted flow rate.

Further, in the plasma processing apparatus 10, a deposit shield 46 is detachably provided along the inner wall of the processing container 12. The deposit shield 46 is also provided on the outer periphery of the support 14. The deposit shield 46 prevents any etching byproduct (deposit) from being attached to the processing container 12, and may be constituted by coating ceramics such as, for example, $Y_2O_3$ on an aluminum material. The deposit shield 46 may be made of an oxygen-containing material such as, for example, quartz, in addition to $Y_2O_3$.

At the bottom side of the processing container 12, an exhaust plate 48 is provided between the support 14 and the inner wall of the processing container 12. The exhaust plate 48 may be constituted by coating ceramics such as, for example, $Y_2O_3$ on an aluminum material. The processing container 12 is formed with an exhaust port 12e below the exhaust plate 48. The exhaust port 12e is connected with an exhaust device 50 through an exhaust pipe 52. The exhaust device 50 is provided with a vacuum pump such as, for example, a turbo molecular pump, and may decompress the space inside the processing container 12 to a desired degree of vacuum. Further, a wafer W carry-in/out port 12g is formed through the side wall of the processing container 12, and the carry-in/out port 12g is able to be opened or closed by a gate valve 54.

The plasma processing apparatus 10 further includes a first high frequency power source 62 and a second high frequency power source 64. The first high frequency power source 62 generates a first high frequency power for plasma generation, and generates a high frequency power of 27 MHz to 100 MHz, for example, 40 MHz. The first high frequency power source 62 is connected to the upper electrode 30 through a matcher 66. The matcher 66 is a circuit configured to match an output impedance of the first high frequency power source 62 and an input impedance of a load side (lower electrode LE side). Meanwhile, the first high frequency power source 62 may be connected to the lower electrode LE through the matcher 66.

The second high frequency power source 64 generates a second high frequency power, that is, a high frequency bias power for drawing electrons into the wafer W, and supplies a high frequency of 400 kHz to 13.56 MHz, for example, 3.2 MHz. The second high frequency power source 64 is connected to the lower electrode LE through a matcher 68. The matcher 68 is a circuit configured to match an output impedance of the second high frequency power source 64 and the input impedance of the load side (lower electrode LE side).

The plasma processing apparatus 10 further includes a power source 70. The power source 70 is connected to the upper electrode 30. The power source 70 applies a voltage to the upper electrode 30 so as to draw positive ions, which are present in the processing space S, into the electrode plate 34. In an example, the power source 70 is a DC power source that generates a negative DC voltage. When such a voltage is applied from the power source 70 to the upper electrode 30, the positive ions present in the processing space S collides with the electrode plate 34. Thus, secondary electrons and/or silicon are released from the electrode plate 34.

Further, in an exemplary embodiment, the plasma processing apparatus 10 may further include a controller Cnt. The controller Cnt is a computer provided with, for example, a processor, a storage unit, an input device, and a display device, and controls each component of the plasma processing apparatus 10. Specifically, the controller Cnt is connected to the valve group 42, the flow rate controller group 44, the exhaust device 50, the first high frequency power source 62, the matcher 66, the second high frequency power source 64, the matcher 68, the power source 70, the heater power source HP, and the chiller unit.

The controller Cnt is operated according to a program based on an input recipe, and transmits a control signal. According to the control signal from the controller Cnt, selection of the gas supplied from the gas source group and a flow rate thereof, exhaust of the exhaust device 50, power supply from the first high frequency power source 62 and the second high frequency power source 64, voltage application from the power source 70, power supply of the heater power source HP, a flow rate of the coolant from the chiller unit, and a temperature of the coolant may be controlled. Further, each step in the workpiece processing method disclosed herein may be executed by operating each unit of the plasma processing apparatus 10 according to the control by the controller Cnt.

Figure 3A:
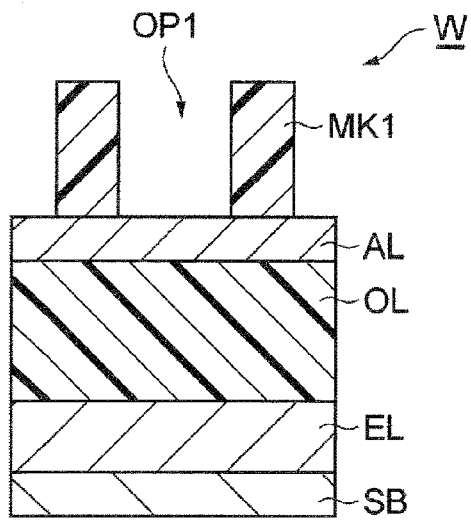
FIGS. 3A to 3C are sectional views each illustrating the state of a workpiece after each step in the method illustrated in FIG. 1 is executed.
Figure 3C:
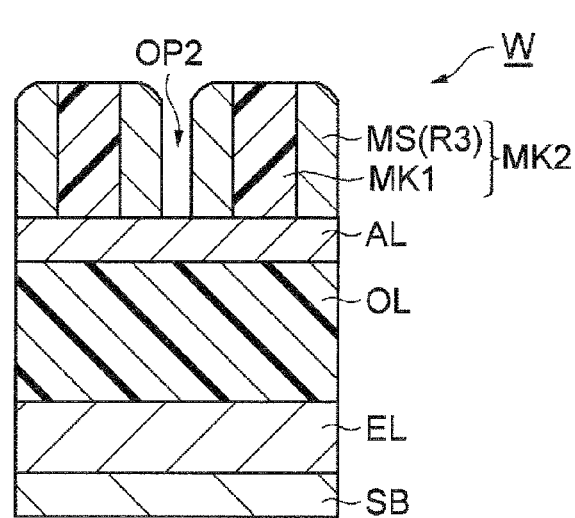
Figure 3B:
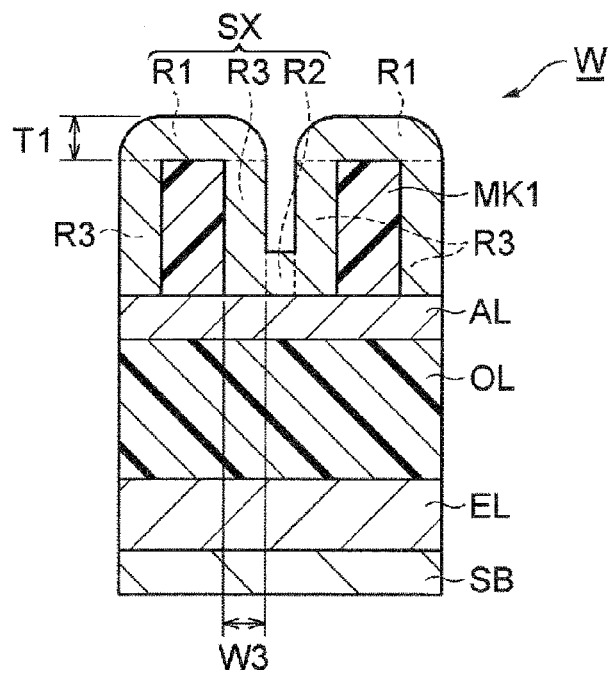
Figure 4A:
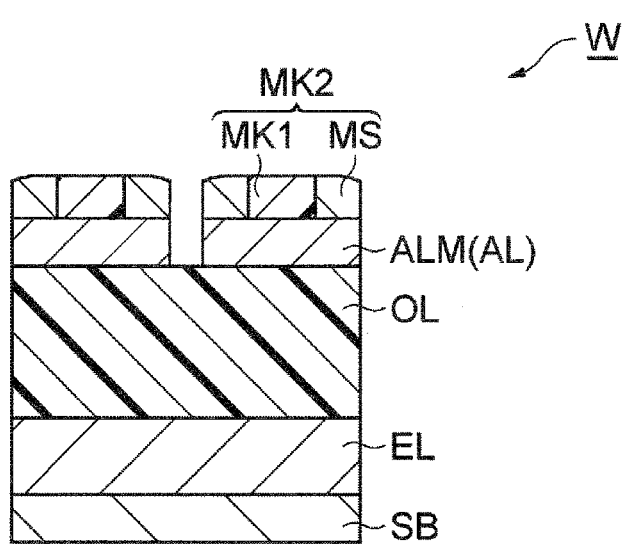
FIGS. 4A to 4C are sectional views each illustrating the state of a workpiece after each step in the method illustrated in FIG. 1 is executed.
Figure 4B:
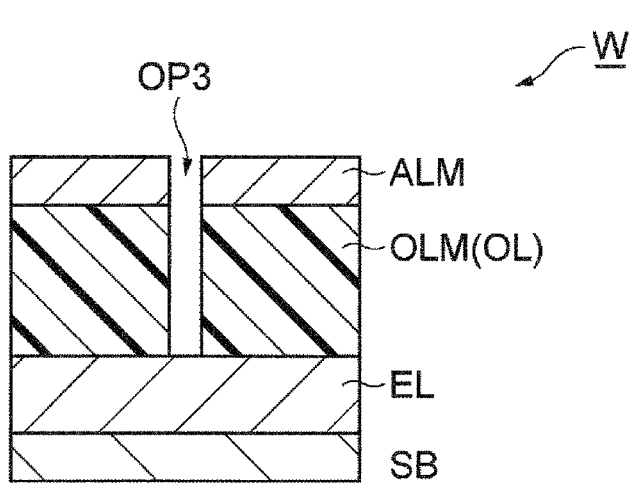
Figure 4C:
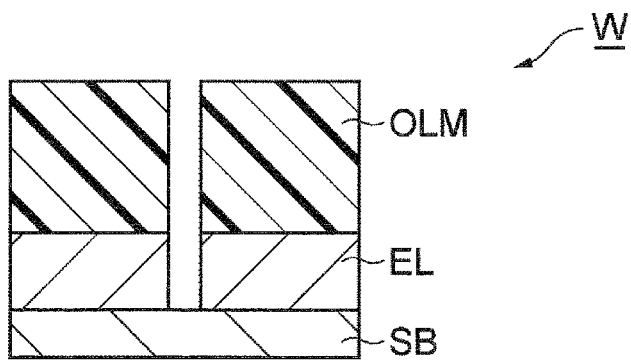
Figure 5A:
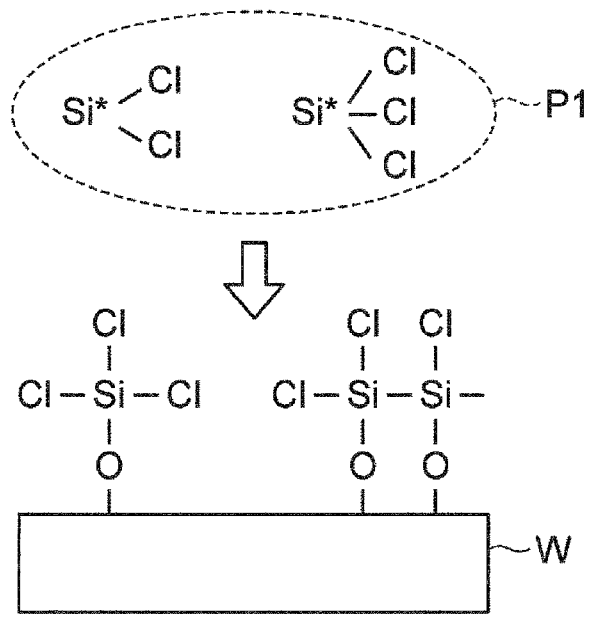
FIGS. 5A and 5B are views for describing a principle of formation of a silicon oxide film.
Figure 5B:
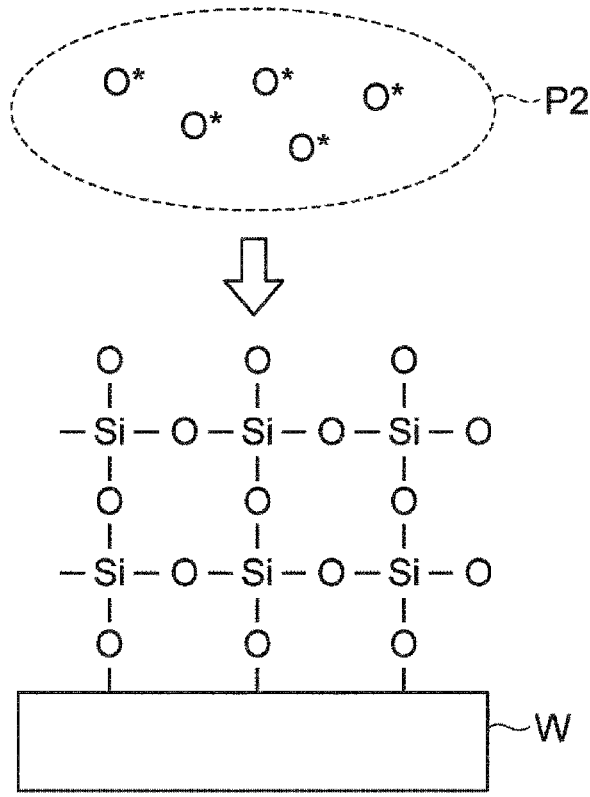

Referring back to FIG. 1, method MT1 will be described in detail. Hereinafter, descriptions will be made on an example in which the plasma processing apparatus 10 is used to perform method MT1. Further, the following descriptions will be made in reference to FIGS. 3A to 3C, FIGS. 4A to 4C, and FIGS. 5A and 5B. FIGS. 3A to 3C and FIGS. 4A to 4C are sectional views each illustrating a workpiece state after each step in the method illustrated in FIG. 1 is executed. FIGS. 5A and 5B are views for describing a principle of formation of a silicon oxide film.

In method MT1 illustrated in FIG. 1, a wafer W is first prepared in step ST1. The wafer W provided in step ST1 includes a substrate SB, an etching target layer EL, an organic film OL, an antireflective film AL, and a mask MK1, as illustrated in FIG. 3A. The etching target layer EL is formed on the substrate SB. The etching target layer EL is a layer made of a material which is selectively etched against the organic film OL. An insulating film is used therefor. The etching target layer EL may be made of, for example, silicon oxide ($SiO_2$). The etching target layer EL may be made of other materials such as, for example, polycrystalline silicon. The organic film OL is a carbon-containing layer such as, for example, a spin-on hardmask (SOH) layer. The antireflective film AL is a silicon-containing antireflective film, and is formed on the organic film OL.

The mask MK1 is provided on the antireflective film AL. The mask MK1 is a resist mask made of a resist material and is fabricated by patterning a resist layer by the photolithography technique. The mask MK1 partially covers the antireflective film AL. Further, the mask MK1 defines an opening OP1 where the antireflective film AL is partially exposed. The pattern of the mask MK1 is, for example, a line-and-space pattern. Further, the mask MK1 may have a pattern that provides a circular opening when viewed from the top. Alternatively, the mask MK1 may have a pattern that provides an elliptical opening when viewed from the top.

In step ST1, a wafer W illustrated in FIG. 3A is prepared. The wafer W is accommodated in the processing container and placed on the pedestal PD.

In method MT1 of an exemplary embodiment, step ST2 is then executed. In step ST2, secondary electrons are irradiated to the wafer W. Specifically, hydrogen gas and a noble gas are supplied into the processing container 12, and a high frequency power is supplied thereto from the first high frequency power source 62 to generate plasma. Further, a negative DC voltage is applied to the upper electrode 30 by the power source 70. Therefore, positive ions in the processing space S are drawn into the upper electrode 70, and the positive ions collide with the upper electrode 30, so that secondary electrons are released from the upper electrode 30. The released secondary electrons are irradiated to the wafer W, so that the mask MK1 is modified. When a high level of the absolute value of the negative DC voltage is applied to the upper electrode 30, the positive ions collide with the electrode plate 34, so that the silicon, which is a constituent material of the electrode plate 34, is released along with the secondary electrons. The released silicon is bonded to oxygen released from the components of the plasma processing apparatus 10 which are exposed to the plasma. The oxygen is released from a member such as, for example, the support 14, the insulating shielding member 32, and the deposition shield 46. A silicon oxide compound is produced by the bonding of the silicon and the oxygen, and the silicon oxide compound is deposited on the wafer W to cover the mask MK1, thereby protecting the mask MK1. By the effects of the modification and protection, the mask MK1 is suppressed from being damaged by subsequent steps. Further, in step ST2, for the modification by the irradiation with the secondary electrons or the formation of the protective film, the bias power of the secondary high frequency power source 64 may be minimized to suppress the release of the silicon.

Subsequently, in method MT1, a sequence SQ is executed once or more. The sequence SQ includes step ST3, step ST4, step ST5, and step ST6. In step ST3, plasma of a first gas containing a silicon halide gas is produced in the processing container 12. Specifically, the silicon halide gas and a noble gas are supplied into the processing container 12 from the gas sources selected among the plurality of gas sources of the gas source group 40. In addition, the high frequency power is supplied from the first high frequency power source 62. Further, the pressure of the space in the processing container 12 is set to a predetermined pressure by operating the exhaust device 50. Thus, the plasma of the first gas is generated. The first gas includes, for example, $SiCl_4$ gas as the silicon halide gas. Further, the first gas may further include a noble gas such as, for example, Ar gas or He gas. Alternatively, the first gas may include $SiBr_4$ gas, $SiF_4$ gas, or $SiH_2Cl_2$ gas as the silicon halide gas.

As illustrated in FIG. 5A, when the plasma P1 of the first gas is generated, a reactive precursor such as, for example, dissociated species of the silicon halide contained in the first gas are produced. The produced precursor is attached to the wafer W. FIG. 5A illustrates an example in which $SiCl_4$ gas is used as the silicon halide gas. In FIG. 5A, the bonding of Si and Cl in the plasma P1 represents a precursor.

In the subsequent step ST4, the space in the processing container 12 is purged. Specifically, the first gas supplied in step ST3 is exhausted. In step ST4, an inert gas such as, for example, nitrogen gas may be supplied as a purge gas to the processing container of the plasma processing apparatus. That is, the purge in step ST4 may be either a gas purge in which the inert gas is poured into the processing container or a purge by evacuation. In step ST4, the precursor excessively attached on the wafer W is removed. Therefore, the precursor forms a very thin film on the wafer W.

In the subsequent step ST5, plasma of a second gas containing oxygen gas is produced in the processing container 12. Specifically, the second gas containing the oxygen gas is supplied into the processing container 12 from a gas source selected among the plurality of gas sources of the gas source group 40. In addition, the high frequency power is supplied from the first high frequency power source 62. Further, the pressure of the space in the processing container 12 is set to a predetermined pressure by operating the exhaust device 50.

As described above, the precursor attached to the wafer W by executing step ST3 contains a bond of silicon and halogen atoms such as, for example, chlorine. The bond energy of silicon and halogen atoms is lower than that of silicon and oxygen. Accordingly, as illustrated in FIG. 5B, the plasma P2 of the second gas is produced, and when active species of the oxygen, for example, oxygen radicals are produced, the halogen atoms of the precursor are substituted by the oxygen. Therefore, a silicon oxide film is formed on the wafer W. In FIG. 5B, "O" represents oxygen.

Referring back to FIG. 1, in subsequent step ST5, the space in the processing container 12 is purged. Specifically, the second gas supplied in step ST5 is exhausted. In step ST6, an inert gas such as, for example, nitrogen gas may be supplied as a purge gas to the processing container of the plasma processing apparatus. That is, the purge in step ST6 may be either a gas purge in which the inert gas is poured into the processing container or a purge by evacuation.

In step ST3 of the sequence SQ, the silicon halide gas is used as a gas for the precursor gas. The silicon halide gas such as, for example, $SiCl_4$ gas, $SiBr_4$ gas, $SiF_4$ gas, or $SiH_2Cl_2$ gas, lies in a vaporized state at normal temperature. Therefore, in step ST3, the silicon-containing precursor may be deposited on the wafer W at a low temperature without using a dedicated film forming apparatus including a vaporizer.

Further, in the sequence SQ, a purge is performed in step ST4, and the halogen atoms in the precursor are substituted by oxygen in subsequent step ST5. Accordingly, as in the ALD method, a thin silicon oxide film may be formed on the surface of the wafer W with a uniform film thickness by executing the sequence SQ once. That is, a thin silicon oxide film may be conformally formed by executing the sequence once. Therefore, method MT1 including the sequence SQ is excellent in controllability of adjusting the width of the opening formed by the mask MK1. Further, since the mask MK1 is covered by the silicon oxide film, a line edge roughness (LER) of the mask formed by the mask MK1 and the silicon oxide film may also be enhanced.

In method MT1, it is determined whether the execution of the sequence SQ is terminated in the subsequent step ST7. Specifically, in step ST7, it is determined whether the number of times of executing the sequence SQ reaches a predetermined number. The number of times of executing the sequence SQ determines the film thickness of the silicon oxide film formed on the wafer W. That is, the final film thickness of the silicon oxide film formed on the wafer W is substantially determined by the product of the film thickness of the silicon oxide film formed by one-time execution of the sequence SQ and the number of times of executing the sequence SQ. Therefore, the number of times of executing the sequence SQ is set depending on a desired film thickness of the silicon oxide film formed on the wafer W.

In method MT1, when it is determined in step ST7 that the number of times of executing the sequence SQ does not reach the predetermined number of execution, the sequence SQ is executed repeatedly. On the contrary, when it is determined in step ST7 that the number of times of executing the sequence SQ reaches a predetermined number of times, the execution of sequence SQ is terminated. Therefore, as illustrated in FIG. 3B, a silicon oxide film SX is formed on the surface of the wafer W. The silicon oxide film SX includes regions R1, regions R2, and regions R3. Each region R3 is a region on a side surface of the mask MK1 that extends along the side surface. Each region R3 extends from the surface of the antireflective film AL to the bottom of the region R1. Each region R1 extends above the top surface of the mask MK1 and above the region R3. Further, each region R2 extends between the adjacent regions R3 and on the surface of the antireflective film AL. As described above, since the sequence SQ forms a silicon oxide film in the same manner as in the ALD method, the film thicknesses of the region R1, the region R2, and the region R3 are substantially the same as each other. Further, according to method MT1, a dense silicon oxide film SX, for example, a film having a film density of 2.28 g/cm$^3$ may be obtained.

In an exemplary embodiment, the pressure in the processing container 12 is set to a pressure of 13.33 Pa (100 mTorr) or more during the execution of step ST3. Further, the high frequency power of the first high frequency power source 62 is set to a power of 100 W or less during the execution of step ST3. When plasma is generated under such a high-pressure and low-power condition, excessive dissociation of the silicon halide gas may be suppressed. That is, active species of the halogen atoms may be suppressed from being excessively generated. Alternatively, the second high frequency power source 64 may be used as a measure for producing the same plasma state in which the excessive dissociation is suppressed. Therefore, it is possible to suppress damage to the mask and/or damage to the silicon oxide film which has already been formed. Further, a difference in film thickness among the region R1, the region R2 and the region R3 may be reduced. Further, when a region where the mask MK1 is densely provided and a region where the mask MK1 is loosely provided are present, that is, when a roughness is present in the pattern of the mask, it is possible to reduce the difference in film thickness between the silicon oxide films to be formed in both regions.

Further, in an exemplary embodiment, during the execution of step ST3, the high frequency bias power is substantially not supplied from the second high frequency power source 64. This is caused by an anisotropic component occurring when the bias power is applied. Thus, the precursor may be isotropically attached to the wafer W by minimizing the bias power. As a result, the uniformity of the film thickness of each silicon oxide film formed in a top surface and side surfaces of the mask MK1, and a surface of a base thereof, may be further enhanced. In addition, when plasma is generated using the second high frequency power source 64, it is necessary to select a condition to minimize ion energy in order to isotropically attach the precursor. Further, the execution of ST5 requires an isotropic reaction, which is similar to step ST3 described above, for substituting the precursor attached in step ST3 with the silicon oxide film. Hence, even in step ST5, the high frequency bias power from the second high frequency power source 64 is substantially not supplied to the lower electrode LE.

When the execution of the above-described sequence SQ is terminated, step ST8 of method MT1 is executed. In step ST8, the silicon oxide film SX is etched so as to remove the region R1 and the region R2. In order to remove the region R1 and the region R2, an anisotropic etching condition is required. Therefore, in step ST8, a processing gas including a fluorocarbon gas is supplied into the processing container 12 from a gas source selected among the plurality of gas sources of the gas source group 40. Further, a high frequency power is supplied from the first high frequency power source 62 to generate plasma. Further, a high frequency power is supplied from the second high frequency power source 64. In addition, the pressure of the space in the processing container 12 is set to a predetermined pressure by operating the exhaust device 50. Accordingly, plasma of the fluorocarbon gas is generated. Fluorine-containing active species in the generated plasma are drawn vertically by the high frequency bias power, so that the region R1 and the region R2 are preferentially etched. As a result, as illustrated in FIG. 3C, the region R1 and the region R2 are removed, and a mask MS is formed from the remaining region R3. The mask MS forms a mask MK2 together with the mask MK1 so as to reduce a width of an opening OP1 of the mask MK1. By the mask MK2, an opening OP2 having a width smaller than that of the opening OP1 is provided.

In the subsequent step ST9, the antireflective film AL is etched. Specifically, a processing gas including a fluorocarbon gas is supplied into the processing container 12 from a gas source selected among the plurality of gas sources of the gas source group 40. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma of the fluorocarbon gas is generated. Fluorine-containing active species in the generated plasma etch a region exposed from the mask MK2 among the entire regions of the antireflective film AL. Accordingly, as illustrated in FIG. 4A, a mask ALM is formed from the antireflective film AL. Thereafter, the mask MK2 may be removed.

In the subsequent step ST10, the organic film OL is etched. Specifically, a processing gas including oxygen gas is supplied into the processing container 12 from a gas source selected among the plurality of gas sources of the gas source group 40. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma of the processing gas including oxygen gas is generated. Active species of the oxygen in the generated plasma etch a region exposed from the mask ALM among the entire regions of the antireflective film AL. Accordingly, as illustrated in FIG. 4B, a mask OLM is formed from the organic film OL. A width of an opening OP3 provided by the mask OLM is substantially the same as the width of the opening OP2 (see FIG. 3C). Alternatively, a processing gas including nitrogen gas and hydrogen gas may be used as a gas for etching the organic film OL.

In the subsequent step ST11, the etching target layer EL is etched. Specifically, a processing gas is supplied into the processing container 12 from a gas source selected among the plurality of gas sources of the gas source group 40. The processing gas may be appropriately selected depending on a material constituting the etching target layer EL. For example, when the etching target layer EL is made of silicon oxide, the processing gas may include a fluorocarbon gas. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma is generated. Active species in the generated plasma etch a region exposed from the mask OLM among the entire regions of the etching target layer EL. Accordingly, as illustrated in FIG. 4C, a pattern of the mask OLM is transferred to the etching target layer EL. According to method MT1, step ST2 to step ST11, that is, the entire steps from the fabrication of the mask based on the resist mask to the etching of the etching target layer may be executed using a single plasma processing apparatus 10.

Hereinafter, descriptions will be made on a workpiece processing method according to another exemplary embodiment. FIG. 6 is a flowchart illustrating a workpiece processing method according to another exemplary embodiment. In the following, descriptions will be made on an example in which the plasma processing apparatus 10 is used in method MT2 illustrated in FIG. 6. FIGS. 7A to 7D and 8A to 8C are sectional views each illustrating a workpiece state after each step in the method illustrated in FIG. 6 is executed.

Figure 7A:
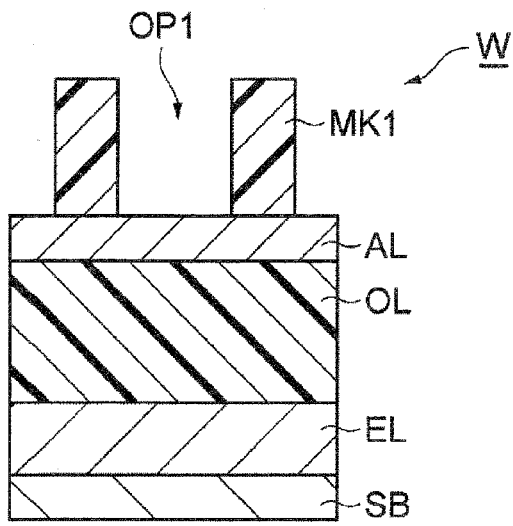
FIGS. 7A to 7D are sectional views each illustrating the state of a workpiece after each step in the method illustrated in FIG. 6 is executed.

In method MT2, step ST21 is first executed. Step ST21 is the same step as step ST1 in method MT1. Accordingly, in step ST21, a wafer W illustrated in FIG. 7A is prepared. The wafer W is accommodated in the processing container 12 and placed on the pedestal PD.

Subsequently, in method MT2, step ST22, which is the same as step ST2 in method MT1, is executed. That is, secondary electrons are irradiated to the wafer W, so that the mask MK1 is modified. When a high level of the absolute value of the negative DC voltage is applied to the upper electrode 30, as described above with respect to step ST2, a silicon oxide compound may be produced by the bonding of the silicon released from the electrode plate 34 by sputtering of the electrode plate 34 and the oxygen released from the components of the plasma processing apparatus 10 exposed to the plasma, and the silicon oxide compound may be deposited on the wafer W to cover the mask MK1, thereby protecting the mask MK1.

In the subsequent step ST23, the antireflective film AL is etched. Specifically, a processing gas including a fluorocarbon gas is supplied into the processing container 12 from a gas source selected among the plurality of gas sources of the gas source group 40. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma of the fluorocarbon gas is generated. Fluorine-containing active species in the generated plasma etch a region exposed from the mask MK1 among the entire regions of the antireflective film AL. Accordingly, as illustrated in FIG. 7B, a mask ALM2 is formed from the antireflective film AL.

Figure 7D:
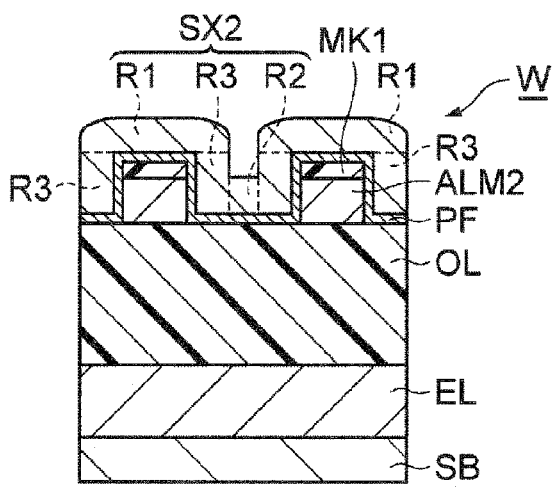
Figure 7B:
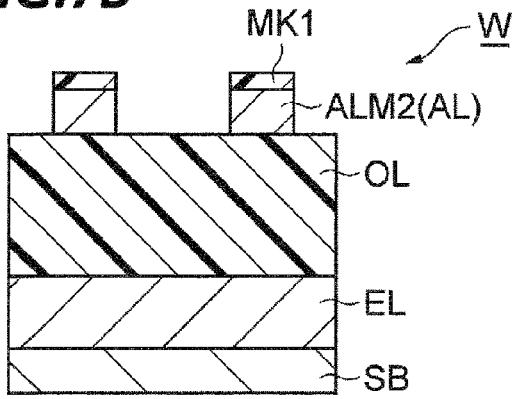

In the subsequent step ST24, a protective film PF is formed on the surface of the wafer W illustrated in FIG. 7B. The protective film PF is formed in order to protect the organic film from active species of oxygen produced when a subsequent sequence SQ2 is executed.

Figure 7C:
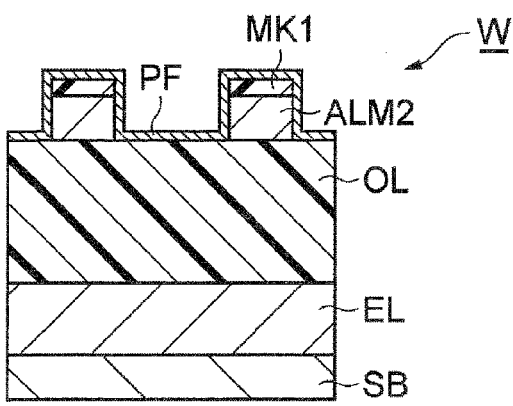

In an exemplary embodiment, the electrode plate 34 of the upper electrode 30 is made of silicon. In step ST24 of the exemplary embodiment, a mixed gas including, for example, hydrogen gas and a noble gas is supplied into the processing container 12 from a gas source selected among the plurality of gas sources of the gas source group 40. Further, a high frequency power is supplied from the first high frequency power source 62. In addition, the pressure of the space in the processing container 12 is set to a predetermined pressure by operating the exhaust device 50. Accordingly, plasma is generated in the processing container 12. Further, a negative DC voltage is applied to the upper electrode 30 from the power source 70. Therefore, positive ions in the plasma collide with the electrode plate 34, so that silicon is released from the electrode plate 34. Further, oxygen is released from the components of the plasma processing apparatus 10 which are exposed to the plasma. The oxygen thus released and the silicon released form the electrode plate 34 are bonded to produce a silicon oxide compound, and the silicon oxide compound is deposited on the wafer W to form the protective film PF as illustrated in FIG. 7C.

In step ST24 of another exemplary embodiment, a mixed gas including a silicon halide gas and oxygen gas is supplied into the processing container 12 from a gas source selected among the plurality of gas sources of the gas source group 40. Further, a high frequency power is supplied from the first high frequency power source 62. In addition, the pressure of the space in the processing container 12 is set to a predetermined pressure by operating the exhaust device 50. Accordingly, silicon oxide is produced, and the silicon oxide is deposited on the wafer W to form the protective film PF as illustrated in FIG. 7C.

In still another exemplary embodiment, the electrode plate 34 of the upper electrode 30 is made of silicon oxide. In step ST24 of the exemplary embodiment, a mixed gas including, for example, hydrogen gas and a noble gas is supplied into the processing container 12 from a gas source selected among the plurality of gas sources of the gas source group 40. Further, a high frequency power is supplied to the upper electrode 30 from the first high frequency power source 62. In addition, the pressure of the space in the processing container 12 is set to a predetermined pressure by operating the exhaust device 50. Accordingly, plasma is generated in the processing container 12. Further, charged particles in the plasma collide with the electrode plate 34 by a sheath voltage generated near the upper electrode 30. Accordingly, silicon oxide is released from the electrode plate 34, and the silicon oxide is deposited on the wafer W to form the protective film PF as illustrated in FIG. 7C. Further, in step ST24, since the silicon oxide is deposited to form a protective film, it is necessary to minimize the bias power of the second high frequency power source 64.

Subsequently, in method MT2, the sequence SQ2 including step ST25, step ST26, step ST27, and step ST28 is executed a predetermined number of times. The sequence SQ2 is the same as the sequence SQ. Therefore, step ST25, step ST26, step ST27, and step ST28 are the same as step ST3, step ST4, step ST5, and step ST6, respectively.

When the sequence SQ2 is executed a predetermined number of times, a silicon oxide film SX2 is formed on the wafer W, as illustrated in FIG. 7D. The silicon oxide film SX2 includes regions R1, regions R2, and regions R3. Each region R3 is a region on a side surface of the mask MK1 and the mask ALM2 that extends along the side surface. Each region R3 extends from the surface of the protective film PF formed on the organic film OL, to the bottom of the region R1. Each region R1 extends above the top surface of the mask MK1 and above the region R3. Further, each region R2 extends between the adjacent regions R3 and on the surface of the organic film OL (i.e., on the protective film PF on the organic film OL). Since the sequence SQ2 forms a silicon oxide film in the same manner as in the ALD method, the film thicknesses of the region R1, the region R2, and the region R3 are substantially the same as each other.

Figure 8A:
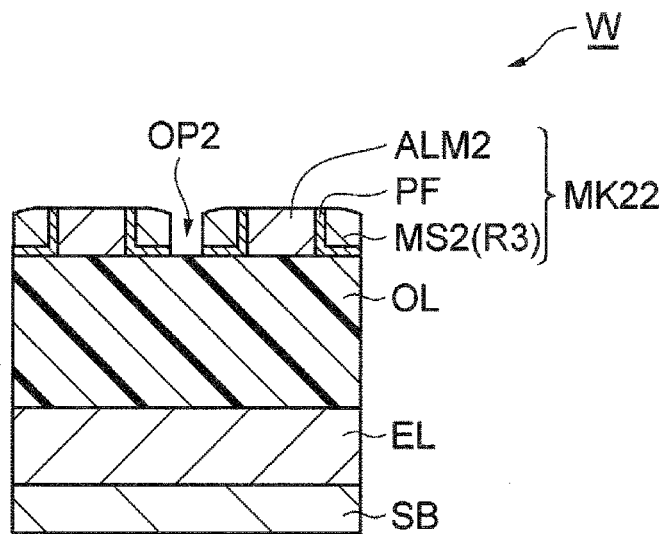
FIGS. 8A to 8C are sectional views each illustrating the state of a workpiece after each step in the method illustrated in FIG. 6 is executed.

Step 29 is the same as step ST7 in method MT1. In step ST29, when it is determined that the number of times of executing the sequence SQ2 reaches the predetermined number of execution, step ST30 is subsequently executed. In step ST30, the silicon oxide SX2 is etched so as to remove the region R1 and the region R2. Specifically, a processing gas including a fluorocarbon gas is supplied into the processing container 12 from a gas source selected among the plurality of gas sources of the gas source group 40. Further, a high frequency power is supplied from the first high frequency power source 62 to generate plasma. Further, a high frequency power is supplied from the second high frequency power source 64. In addition, the pressure of the space in the processing container 12 is set to a predetermined pressure by operating the exhaust device 50. Accordingly, plasma of the fluorocarbon gas is generated. Fluorine-containing active species in the generated plasma are drawn vertically by the high frequency bias power, so that the region R1 and the region R2 are preferentially etched. As a result, as illustrated in FIG. 8A, the region R1 and the region R2 are removed, and a mask MS2 is formed from the remaining region R3. The mask MS2 forms a mask MK22 together with the mask ALM2 so as to reduce the width of the opening OP1 of the mask MK1. By the mask MK22, an opening OP2 having a width smaller than that of the opening OP1 is provided.

Figure 8B:
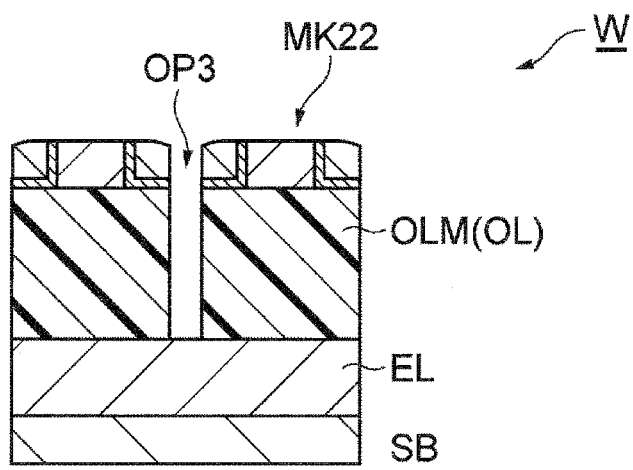

In the subsequent step ST31, the organic film OL is etched. Specifically, a processing gas including oxygen gas is supplied into the processing container 12 from a gas source selected among the plurality of gas sources of the gas source group 40. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma of the processing gas including oxygen gas is generated. Active species of the oxygen in the generated plasma etch a region exposed from the mask MK22 among the entire regions of the organic film OL. Accordingly, as illustrated in FIG. 8B, a mask OLM is formed from the organic film OL. A width of an opening OP3 provided by the mask OLM is substantially the same as the width of the opening OP2 (see FIG. 8A).

Figure 8C:
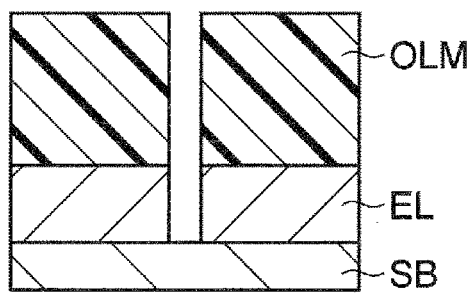

In the subsequent step ST32, the etching target layer EL is etched. Specifically, a processing gas is supplied into the processing container 12 from a gas source selected among the plurality of gas sources of the gas source group 40. The processing gas may be appropriately selected depending on a material constituting the etching target layer EL. For example, when the etching target layer EL is made of silicon oxide, the processing gas may include a fluorocarbon gas. Further, a high frequency power is supplied from the first high frequency power source 62. Further, a high frequency power is supplied from the second high frequency power source 64. In addition, the pressure of the space in the processing container 12 is set to a predetermined pressure by operating the exhaust device 50. Accordingly, plasma is generated. Active species in the generated plasma etch a region exposed from the mask OLM among the entire regions of the etching target layer EL. Accordingly, as illustrated in FIG. 8C, a pattern of the mask OLM is transferred to the etching target layer EL.

According to method MT2, the silicon-containing precursor may be deposited on the wafer W at a low temperature without using a dedicated film forming apparatus including a vaporizer. Further, since the silicon oxide film is formed by the sequence SQ2 which is the same as the ALD method, method MT2 is excellent in controllability of adjusting the width of the opening formed by the mask MK1. Further, according to method MT2, since the mask ALM2 is covered by the silicon oxide film, a line edge roughness (LER) of the mask formed by the mask ALM2 and the silicon oxide film may also be enhanced. In addition, according to method MT2, step ST22 to step ST32, that is, the entire steps from the fabrication of the mask based on the resist mask to the etching of the etching target layer may be executed using a single plasma processing apparatus 10.

Although various exemplary embodiments have been described, various modifications may be made without being limited thereto. For example, in the exemplary embodiments described above, the capacitively coupled plasma processing apparatus 10 are used. However, in a method in which a process of releasing silicon or silicon oxide rom the upper electrode is omitted from both of method MT1 and method MT2, the method may be performed using a plasma processing apparatus having an arbitrary plasma source. Such a plasma processing apparatus may include, for example, an inductively coupled plasma processing apparatus, and a plasma processing apparatus using surface waves such as microwaves.

Hereinafter, descriptions will be made on various tests which were performed for evaluations of method MT1 and method MT2.

Test Examples 1 to 3

In Test Examples 1 to 3, with respect to the wafer illustrated in FIG. 3A, step ST2 and the sequence SQ were executed using the plasma processing apparatus 10. Further, in Test Examples 1 to 3, the pressure in the processing container 12 and the high frequency power of the first high frequency power source 62 during the execution of step ST3 were changed as parameters. Specifically, in Test Example 1, the pressure in the processing container 12 and the high frequency power of the first high frequency power source 62 in step ST3 were set to 200 mTorr (26.66 Pa) and 500 W, respectively. In Test Example 2, the pressure in the processing container 12 and the high frequency power of the first high frequency power source 62 in step ST3 were set to 200 mTorr (26.66 Pa) and 500 W, respectively. In Test Example 3, the pressure in the processing container 12 and the high frequency power of the first high frequency power source 62 in step ST3 were set to 200 mTorr (26.66 Pa) and 100 W, respectively. Other conditions of step ST2 and the sequence SQ executed in Test Examples 1 to 3 were listed as follows. In addition, the number of times of executing the sequence SQ was 72.

Figure 9:
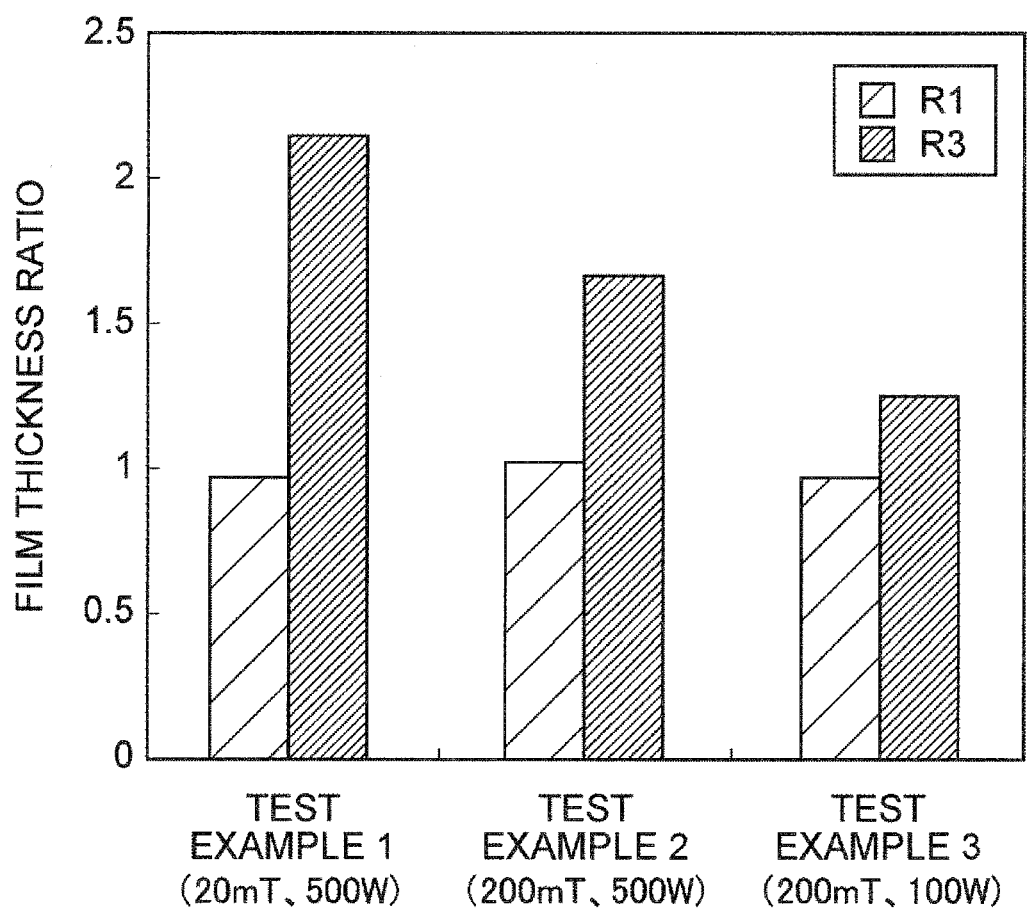
FIG. 9 is a graph illustrating test results.

<Conditions of Step ST2>
Pressure in processing container: 50 mTorr (6.66 Pa)
Flow rate of hydrogen gas: 100 sccm
Flow rate of Ar gas: 800 sccm
High frequency power of first high frequency power source 62 (supplied to upper electrode 30): 60 MHz, 300 W
High frequency bias power of second high frequency power source 64: 13 MHz, 0 W
Applied voltage of power source 70: −1,000 V
Processing time: 60 seconds
<Conditions of Step ST3>
Pressure in processing container: 200 mTorr (26.66 Pa)
Flow rate of $SiCl_4$ gas: 20 sccm
Flow rate of Ar gas: 200 sccm
High frequency power of first high frequency power source 62 (supplied to upper electrode 30): 60 MHz, 100 W High frequency bias power of second high frequency power source 64: 13 MHz, 0 W
Processing time: 5 seconds
<Conditions of Step ST5>
Pressure in processing container: 200 mTorr (26.66 Pa)
Flow rate of oxygen gas: 200 sccm
Flow rate of Ar gas: 200 sccm
High frequency power of first high frequency power source 62 (supplied to upper electrode 30): 60 MHz, 500 W
High frequency bias power of second high frequency power source 64: 13 MHz, 0 W
Processing time: 5 seconds Then, the film thickness of the silicon oxide film formed on the top surface of the mask MK1 (a film thickness T1 of the region R1 illustrated in FIG. 3B) and the film thickness of the silicon oxide formed on the side surface of the mask MK1 (a film thickness W3 of the region R3 illustrated in FIG. 3B) were measured in both of a region where a line pattern of the mask MK1 is loosely provided (hereinafter, referred to as a "loose region") and a region where the line pattern is densely provided (hereinafter, referred to as a "dense region"). And, a film thickness ratio, that is, a ratio of the film thickness of the region R1 in the loose region to the film thickness of the region R1 in the dense region, and a film thickness ratio, that is, a ratio of the film thickness of the region R3 in the loose region to the film thickness of the region R3 in the dense region were calculated. The results are illustrated in FIG. 9. Further, in FIG. 9, the legend "R1" represents the film thickness ratio calculated from the film thickness of the region R1, and the legend "R3" represents the film thickness ratio calculated from the film thickness of the region R3.

As illustrated in FIG. 9, as the high frequency power of the first high frequency power source 62 was reduced, the film thickness ratio was closer to 1. That is, the difference in film thickness between the silicon oxide films formed in the dense region and the loose region was reduced. More specifically, when the high frequency power of the first high frequency power was 500 W rather than 100 W, the film thickness ratio was closer to 1. Therefore, it has been confirmed that, when the high frequency power of the first high frequency power source 62 is 100 W or less, the difference in film thickness between the silicon oxide film formed in the dense region and the silicon oxide film formed in the loose region may be reduced. Further, as illustrated in FIG. 9, it has been confirmed that, when step ST3 is executed under a condition that the pressure in the processing container 12 is high, that is, under a high-pressure condition, the difference between the film thickness ratio of the region R1 and the film thickness ratio of the region R3 is reduced. That is, it has been confirmed that, when step ST3 is executed under the high-pressure condition, the difference between the film thickness T1 of the region R1 and the film thickness W3 of the region R3 is reduced.

Test Example 4

Figure 10:
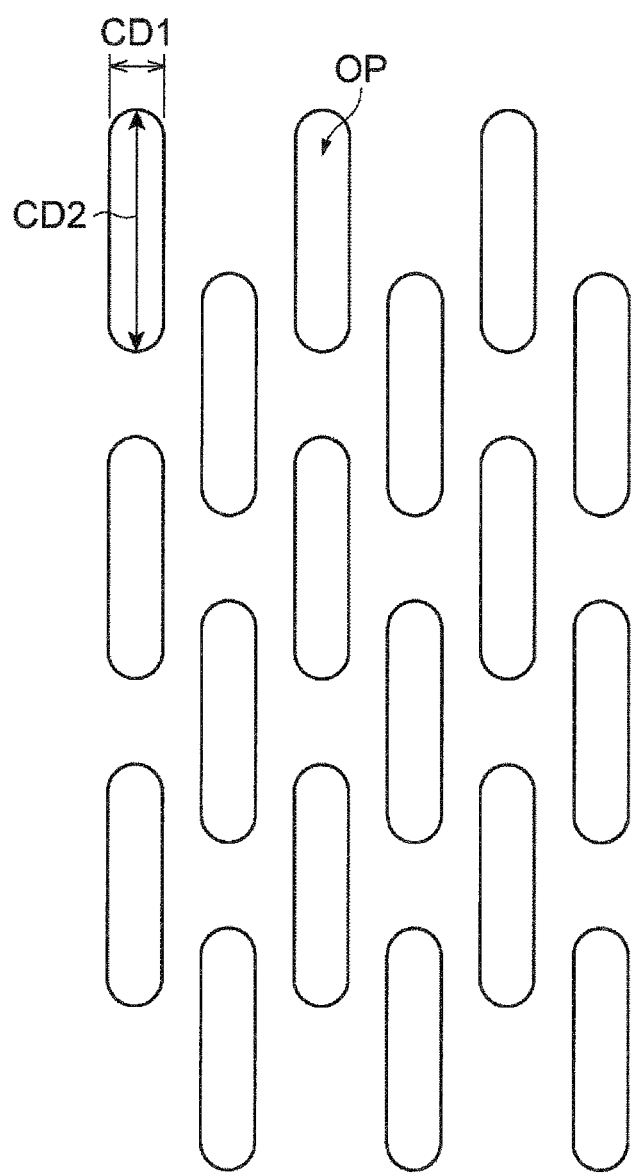
FIG. 10 is a plan view illustrating a pattern of a mask MK1 used in a test.
Figure 11:
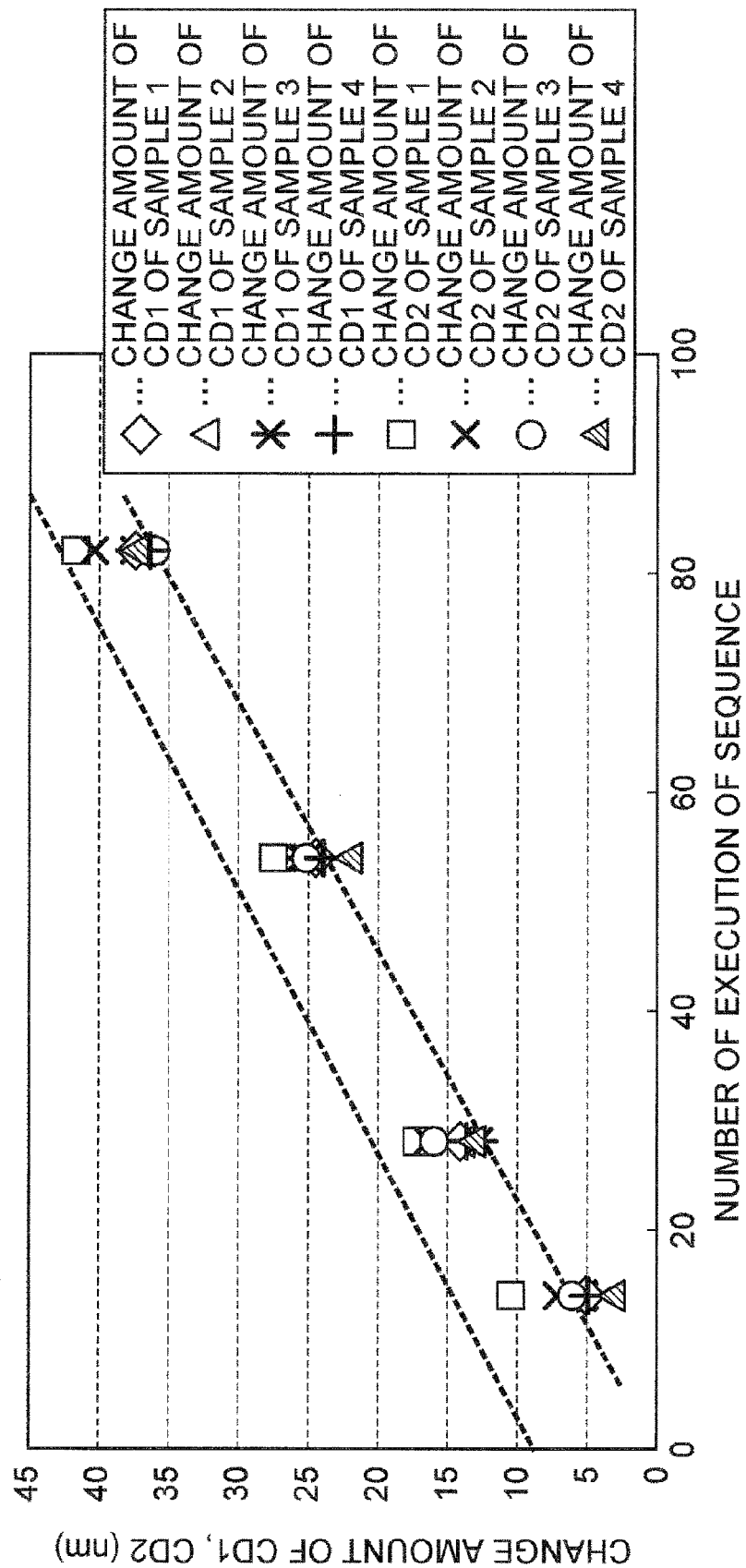
FIG. 11 is a graph illustrating test results.

In Test Example 4, as illustrated in FIG. 10, wafers W of Samples 1 to 4 having a mask MK1 were prepared. The mask MK1 is provided with a plurality of elliptical openings OP which are two-dimensionally arranged. A minor axis width CD1 and a major axis width CD2 of each sample were set to be different from CD1 and CD2 of other samples. And, with respect to Samples 1 to 4, step ST2 and the sequence SQ were executed using the plasma processing apparatus 10. Further, in Test Example 4, the number of times of executing the sequence SQ was changed as a parameter. Conditions of step ST2 and the sequence SQ executed in Test Example 4 are listed as follows.
<Conditions of Step ST2>
Pressure in processing container: 50 mTorr (6.66 Pa)
Flow rate of hydrogen gas: 100 sccm
Flow rate of Ar gas: 800 sccm
High frequency power of first high frequency power source 62 (supplied to upper electrode 30): 60 MHz, 300 W
High frequency bias power of second high frequency power source 64: 13 MHz, 0 W
Applied voltage of power source 70: −1,000 V
Processing time: 60 seconds
<Conditions of Step ST3>
Pressure in processing container: 200 mTorr (26.66 Pa)
Flow rate of $SiCl_4$ gas: 20 sccm
Flow rate of Ar gas: 200 sccm
High frequency power of first high frequency power source 62 (supplied to upper electrode 30): 60 MHz, 100 W
High frequency bias power of second high frequency power source 64: 13 MHz, 0 W
Processing time: 5 seconds
<Conditions of Step ST5>
Pressure in processing container: 200 mTorr (26.66 Pa)
Flow rate of oxygen gas: 200 sccm
Flow rate of Ar gas: 200 sccm
High frequency power of first high frequency power source 62 (supplied to upper electrode 30): 60 MHz, 500 W
High frequency bias power of second high frequency power source 64: 13 MHz, 0 W
Processing time: 5 seconds Then, with respect to Samples 1 to 4, a relationship between the number of times of executing the sequence SQ and a change amount of the minor axis width CD1 of the opening OP or a change amount of the major axis width CD2 of the opening OP was obtained, respectively. The results are illustrated in FIG. 11. In FIG. 11, the horizontal axis represents the number of times of executing of the sequence SQ, and the vertical axis represents the change amounts of CD1 and CD2. As illustrated in FIG. 11, as a result of Test Sample 4, the change amount of the minor axis width CD1 and the change amount of the major axis width CD2 of the opening OP were equally increased depending on the number of times of executing the sequence SQ. In this regard, it has been confirmed that the width of the elliptical opening may be uniformly reduced in any direction, depending on the number of times of executing the sequence SQ.

Test Examples 5 and 6 and Comparative Test Examples 1 and 2

In Test Example 5, with respect to the wafer W illustrated in FIG. 3A, steps ST3 to ST10 were executed using the plasma processing apparatus 10. The number of times of executing the sequence SQ in Test Example 5 was 72. Further, in Test Example 6, with respect to the wafer W illustrated in FIG. 3A, steps ST2 to ST10 were executed using the plasma processing apparatus 10. The number of times of executing the sequence SQ in Test Example 6 was 72. Further, in Comparative Test Example 1, with respect to the wafer W illustrated in FIG. 3A, an etching step of the antireflective film AL and an etching step of the organic film OL were sequentially performed using the plasma processing apparatus 10. In Comparative Test Example 2, with respect to the wafer W illustrated in FIG. 3A, a modifying step of the mask MK1 by irradiation with secondary electrons, an etching step of the antireflective film AL, and an etching step of the organic film OL were sequentially performed. Further, in Comparative Test Examples 1 and 2, conditions of respective steps were set such that the width of the opening of the mask finally fabricated from the organic film OL is equal to the width of the opening of the mask fabricated from the organic film OL in Test Examples 5 and 6. Conditions of step ST2 and the sequence SQ executed in Test Examples 5 and 6 are listed as follows.

<Conditions of Step ST2>
Pressure in processing container: 50 mTorr (6.66 Pa)
Flow rate of hydrogen gas: 100 sccm
Flow rate of Ar gas: 800 sccm
High frequency power of first high frequency power source 62 (supplied to upper electrode 30): 60 MHz, 300 W
High frequency bias power of second high frequency power source 64: 13 MHz, 0 W
Applied voltage of power source 70: −1,000 V
Processing time: 60 seconds
<Conditions of Step ST3>
Pressure in processing container: 200 mTorr (26.66 Pa)
Flow rate of $SiCl_4$ gas: 20 sccm
Flow rate of Ar gas: 200 sccm
High frequency power of first high frequency power source 62 (supplied to upper electrode 30): 60 MHz, 100 W
High frequency bias power of second high frequency power source 64: 13 MHz, 0 W
Processing time: 5 seconds
<Conditions of Step ST5>
Pressure in processing container: 200 mTorr (26.66 Pa)
Flow rate of oxygen gas: 200 sccm
Flow rate of Ar gas: 200 sccm
High frequency power of first high frequency power source 62 (supplied to upper electrode 30): 60 MHz, 500 W
High frequency bias power of second high frequency power source 64: 13 MHz, 0 W
Processing time: 5 seconds Then, after the execution of Test Example 5, Test Example 6, Comparative Example 1, and Comparative Example 2, a sum of a line edge roughness (LER), a line width roughness (LWR), and a sidewall roughness (SWR) of the mask formed from the organic film OL was obtained. As a result, in Test Example 5, Test Example 6, Comparative Example 1, and Comparative Example 2, the sum of the LER, the LWR, and the SWR was 7.0 nm, 6.7 nm, 8.5 nm and 7.5 nm, respectively. Therefore, it has been confirmed that the LER of the mask may be enhanced, that is, the LER may be reduced by the method including the sequence SQ.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A workpiece processing method including:
a first process of generating plasma of a first gas containing a silicon halide gas in a processing container of a plasma processing apparatus that accommodates a workpiece including an etching target layer, an organic film formed on the etching target layer, a silicon-containing antireflective film formed on the organic film, and a first mask having a resist mask provided on the antireflective film, to form a reactive precursor;
a second process of purging a space in the processing container;
a third process of generating plasma of a second gas containing oxygen gas in the processing container to form a silicon oxide film including a first region, a second region, and a third region, and the first region extending above a top surface of the first mask and above the third region, and the second region extending between adjacent third regions and on a surface of the antireflective film, and the third region extending from the surface of the antireflective film to a bottom of the first region; and
a fourth process of purging the space in the processing container,
wherein a sequence including the first process to the fourth process is repeated,
after executing the sequence including the first process to the fourth process, the method further comprises:
removing the first region and the second region of the silicon oxide film by plasma of a third gas including a fluorocarbon gas in the processing container;
etching the antireflective film by the plasma of the third gas including the fluorocarbon gas in the processing container using a second mask including the first mask and the third region of the silicon oxide film; and
etching the organic film by the plasma of the second gas including the oxygen gas in the processing container, and
in the first process, the processing container is set to a high-pressure and low-power condition that a pressure therein is 13.33 Pa or more, a power of a high-frequency power source for plasma generation is 100 W or less, and no bias power for drawing ions is applied to a pedestal that supports the workpiece.

2. The workpiece processing method of claim 1, wherein the silicon halide gas is $SiCl_4$ gas.

3. The workpiece processing method of claim 1, wherein the plasma processing apparatus is a capacitively coupled plasma processing apparatus, and
before executing the sequence including the first process to the fourth process, the method further comprises:
irradiating secondary electrons to the first mask by generating plasma in the processing container and applying a negative DC voltage to an upper electrode of the plasma processing apparatus.

4. A workpiece processing method including:
etching an antireflective film by plasma of a third gas including a fluorocarbon gas in a processing container of a plasma processing apparatus that accommodates a workpiece including an etching target layer, an organic film formed on the etching target layer, and the antireflective film formed on the organic film, and a first mask having a resist mask provided on the antireflective film organic film, to form a second mask;
a first process of generating plasma of a first gas containing a silicon halide gas in the processing container to form a reactive precursor;
a second process of purging a space in the processing container;
a third process of generating plasma of a second gas containing oxygen gas in the processing container to form a silicon oxide film including a first region, a second region, and a third region, and the first region extending above a top surface of the first mask and above the third region, and the second region extending between adjacent third regions and on a surface of the organic film, and the third region formed on a side surface of the first mask and the second mask; and a fourth process of purging the space in the processing container;

wherein a sequence including the first process to the fourth process is repeated, after executing the sequence including the first process to the fourth process, the method further comprises:

removing the first region and the second region of the silicon oxide film by the plasma of the third gas including the fluorocarbon gas in the processing container; and etching the organic film by the plasma of the second gas including oxygen gas in the processing container using a third mask including the second mask and the third region of the silicon oxide film, and in the first process, the processing container is set to a high-pressure and low-power condition that a pressure therein is 13.33 Pa or more, a power of a high-frequency power source for plasma generation is 100 W or less, and no bias power for drawing ions is applied to a pedestal that supports the workpiece.

5. The workpiece processing method of claim 4, wherein the plasma processing apparatus is a capacitively coupled plasma processing apparatus, and before etching the antireflective film, the method further comprises:

irradiating secondary electrons to the resist mask by generating plasma in the processing container and applying a negative DC voltage to an upper electrode of the plasma processing apparatus.

6. The workpiece processing method of claim 4, further comprising:

forming a silicon oxide protective film on the workpiece after etching the antireflective film and before executing the sequence including the first process to the fourth process.

7. The workpiece processing method of claim 6, wherein the plasma processing apparatus is a capacitively coupled plasma processing apparatus, and in the forming of the silicon oxide protective film, plasma is generated in the processing container and a negative DC voltage is applied to a silicon upper electrode of the plasma processing apparatus.

8. The workpiece processing method of claim 6, wherein, in the forming of the silicon oxide protective film, plasma of a mixed gas containing a silicon halide gas and oxygen gas is generated in the processing container.

9. The workpiece processing method of claim 6, wherein the plasma processing apparatus is a capacitively coupled plasma processing apparatus, and in the forming of the silicon oxide protective film, a high frequency power for plasma generation is supplied to a silicon oxide upper electrode of the plasma processing apparatus to generate plasma of a mixed gas containing hydrogen gas and a noble gas.

* * * * *